(12) United States Patent
Feustel et al.

(10) Patent No.: US 8,048,811 B2
(45) Date of Patent: Nov. 1, 2011

(54) METHOD FOR PATTERNING A METALLIZATION LAYER BY REDUCING RESIST STRIP INDUCED DAMAGE OF THE DIELECTRIC MATERIAL

(75) Inventors: Frank Feustel, Dresden (DE); Thomas Werner, Moritzburg (DE); Juergen Boemmels, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 12/354,884

(22) Filed: Jan. 16, 2009

(65) Prior Publication Data

US 2009/0246951 A1 Oct. 1, 2009

(30) Foreign Application Priority Data

Mar. 31, 2008 (DE) .................... 10 2008 016 425

(51) Int. Cl.
*H01L 21/308* (2006.01)
(52) U.S. Cl. ........ 438/717; 438/624; 438/625; 438/637; 438/694; 438/734; 257/E21.257; 257/E21.579
(58) Field of Classification Search .................. 438/624, 438/637, 638, 700, 717, 738, 625, 639, 694, 438/734, 736; 257/E21.257, E21.576, E21.579, 257/E21.577; 216/47, 51, 72, 74
See application file for complete search history.

(56) References Cited

U.S. PATENT DOCUMENTS

| | | | |
|---|---|---|---|
| 6,448,176 B1 | 9/2002 | Grill et al. | 438/637 |
| 6,583,054 B2 * | 6/2003 | Kwon | 438/638 |
| 6,638,871 B2 * | 10/2003 | Wang et al. | 438/694 |
| 6,853,043 B2 * | 2/2005 | Yeh et al. | 257/437 |
| 6,890,869 B2 | 5/2005 | Chung | 438/794 |
| 6,979,579 B1 | 12/2005 | Kim et al. | 438/14 |
| 7,358,182 B2 * | 4/2008 | Baks et al. | 438/637 |
| 2002/0009873 A1 | 1/2002 | Usami | 438/620 |
| 2003/0040172 A1 | 2/2003 | Brennan | 438/622 |
| 2003/0045124 A1 | 3/2003 | Shih et al. | 438/763 |
| 2004/0100779 A1 | 5/2004 | Kraft | 361/760 |
| 2004/0132277 A1 * | 7/2004 | Maekawa | 438/622 |
| 2005/0037605 A1 * | 2/2005 | Kim et al. | 438/622 |
| 2005/0167839 A1 | 8/2005 | Wetzel et al. | 257/758 |
| 2005/0266355 A1 * | 12/2005 | Matsui et al. | 430/323 |
| 2005/0282382 A1 | 12/2005 | Ko et al. | 438/637 |
| 2006/0270214 A1 | 11/2006 | Iba | 438/637 |
| 2007/0075428 A1 * | 4/2007 | Wang et al. | 257/751 |
| 2007/0105362 A1 * | 5/2007 | Kim et al. | 438/618 |
| 2007/0231750 A1 * | 10/2007 | Parikh | 430/316 |

OTHER PUBLICATIONS

Translation of Official Communication from German Patent Office for German Patent Application No. 10 2008 016 425.9-33 dated Dec. 4, 2008.

Translation of Official Communication from German Patent Office for German Patent Application No. 10 2008 016 425.9 dated Jul. 14, 2009.

* cited by examiner

*Primary Examiner* — Julio J Maldonado
(74) *Attorney, Agent, or Firm* — Williams, Morgan & Amerson, P.C.

(57) ABSTRACT

By forming a hardmask layer in combination with one or more cap layers, undue exposure of a sensitive dielectric material to resist stripping etch ambients may be reduced and integrity of the hardmask may also be maintained so that the trench etch process may be performed with a high degree of etch selectivity during the patterning of openings in a metallization layer of a semiconductor device.

24 Claims, 5 Drawing Sheets

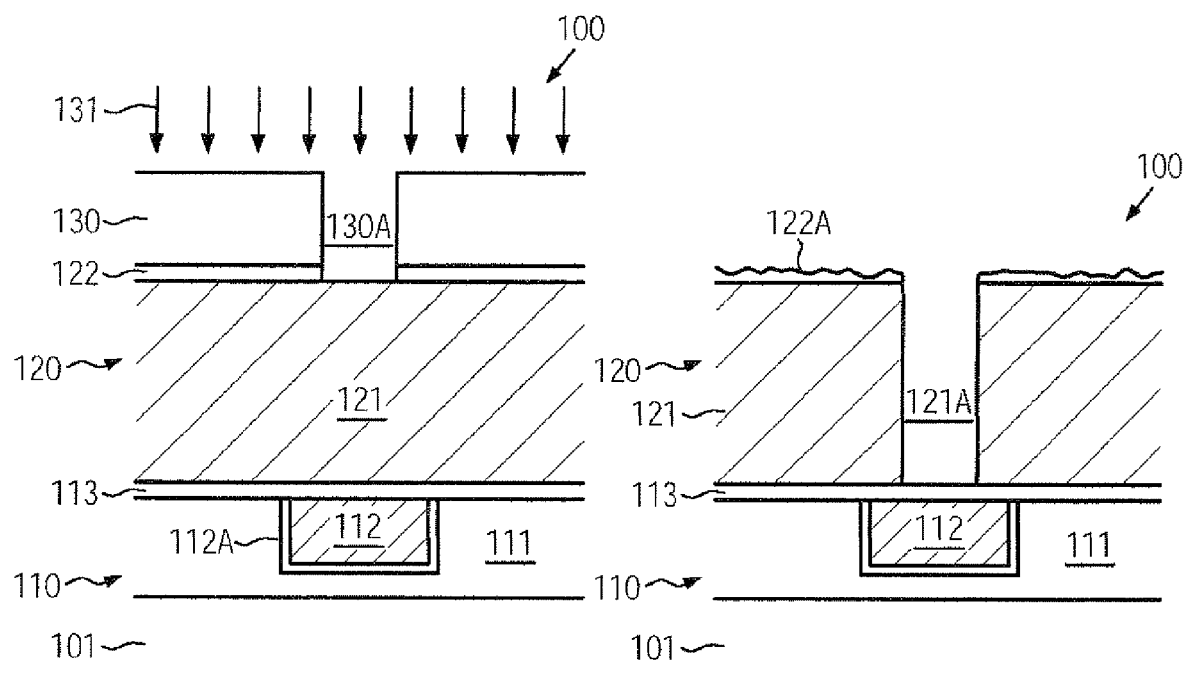
FIG. 1a (prior art)
FIG. 1b (prior art)
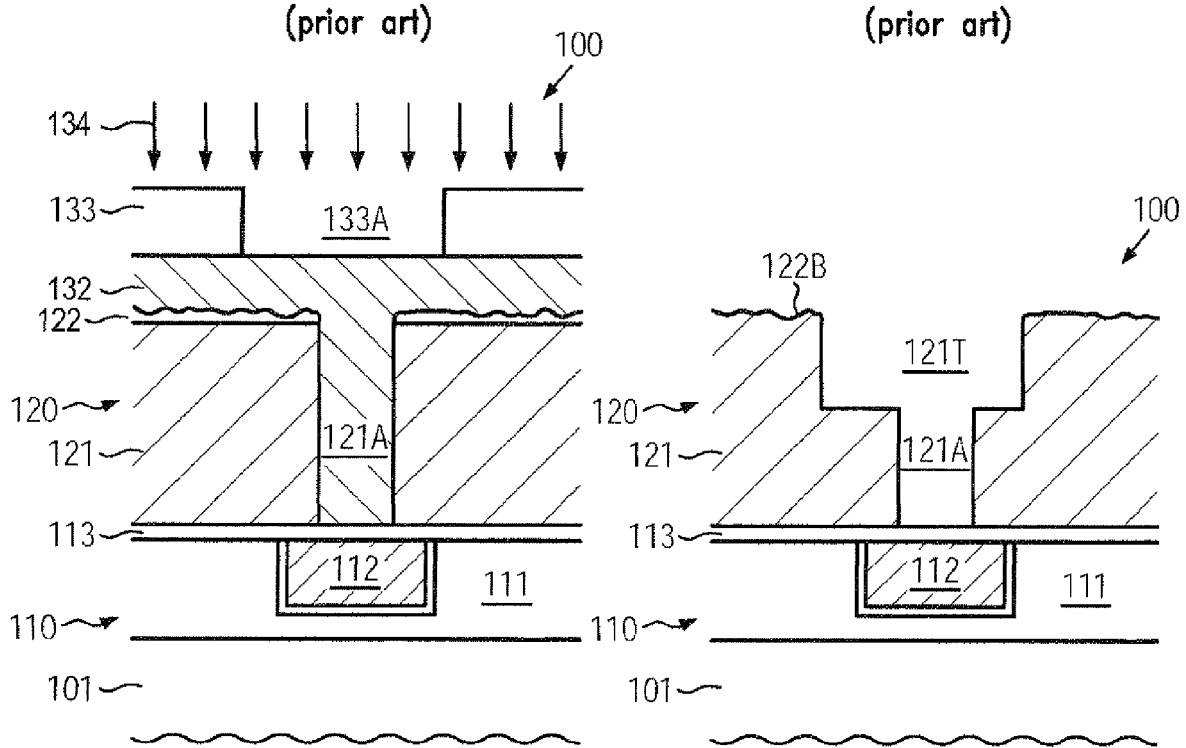
FIG. 1c (prior art)
FIG. 1d (prior art)

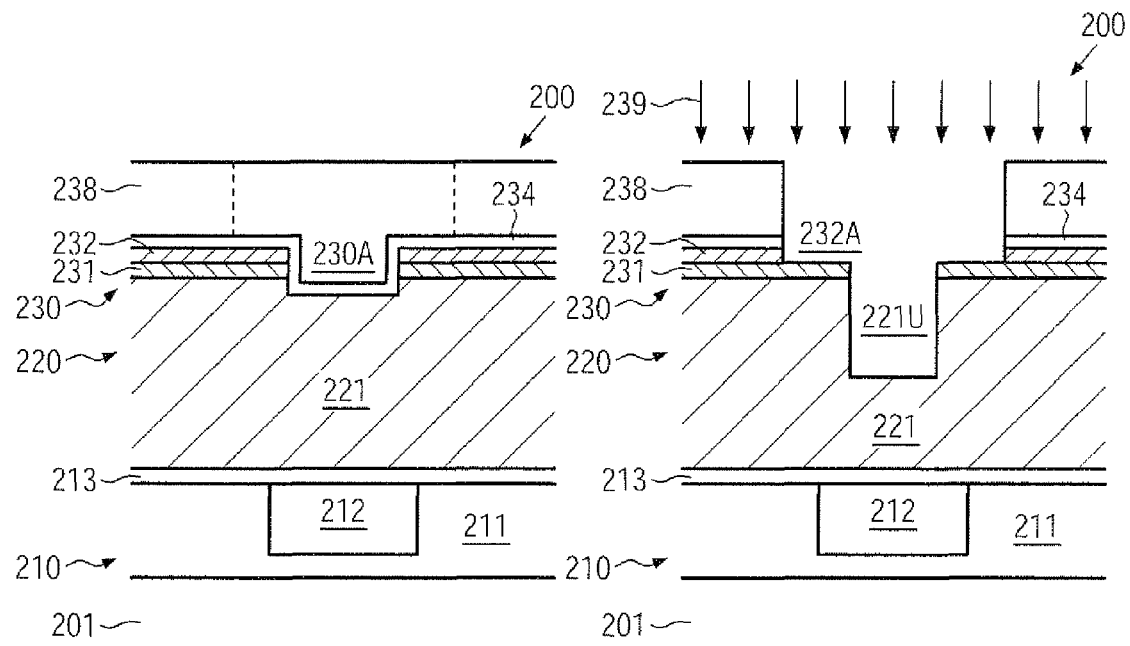
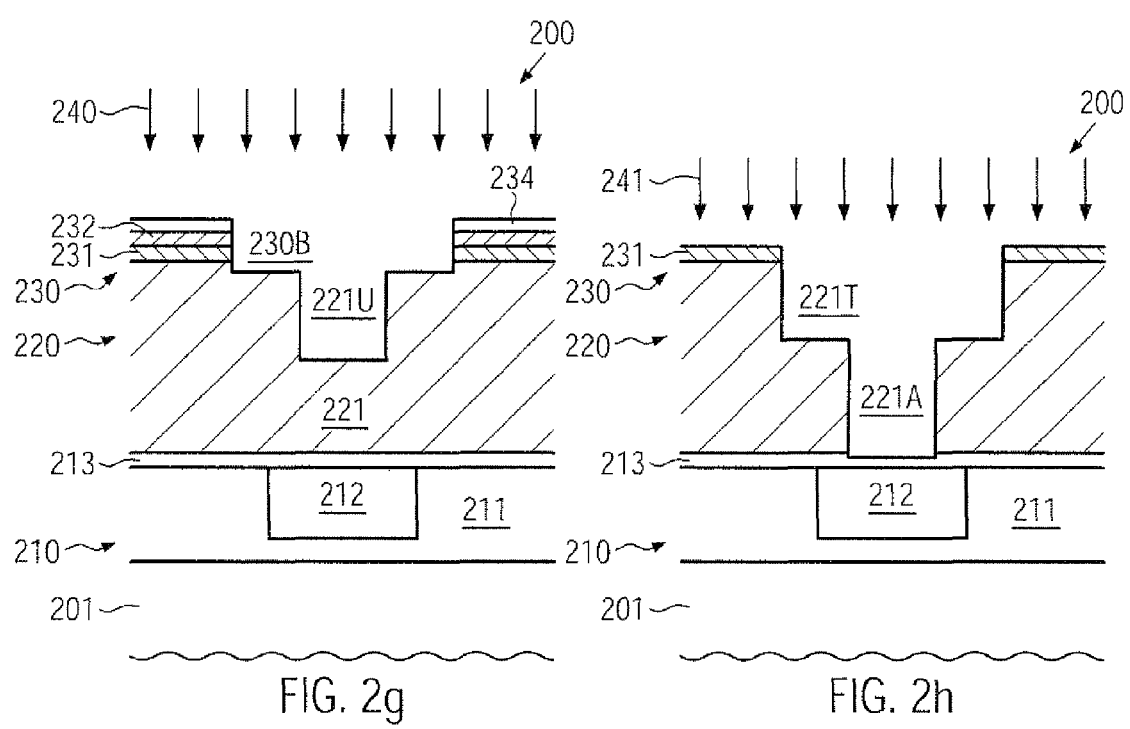

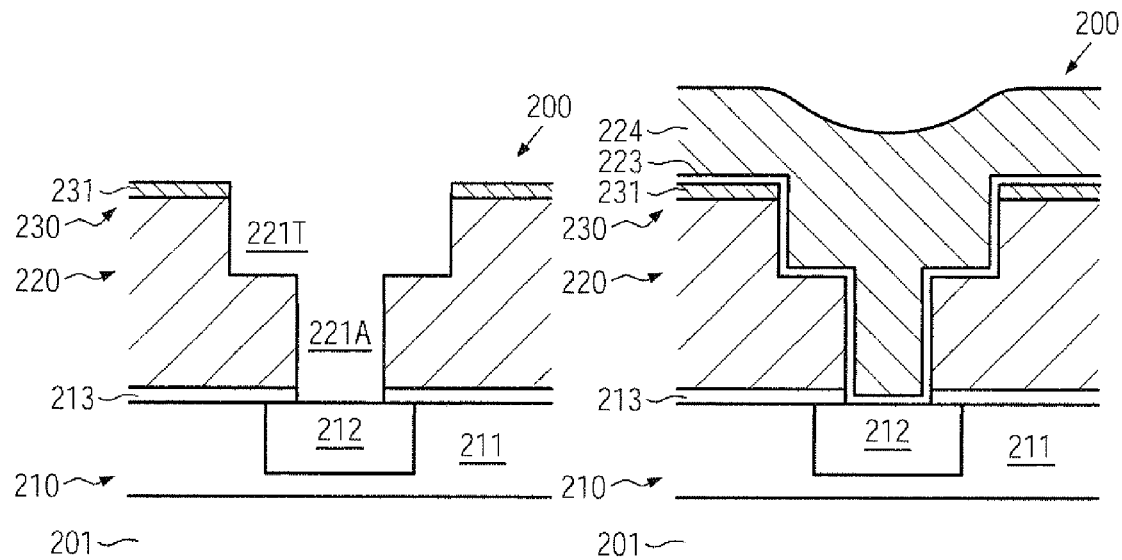
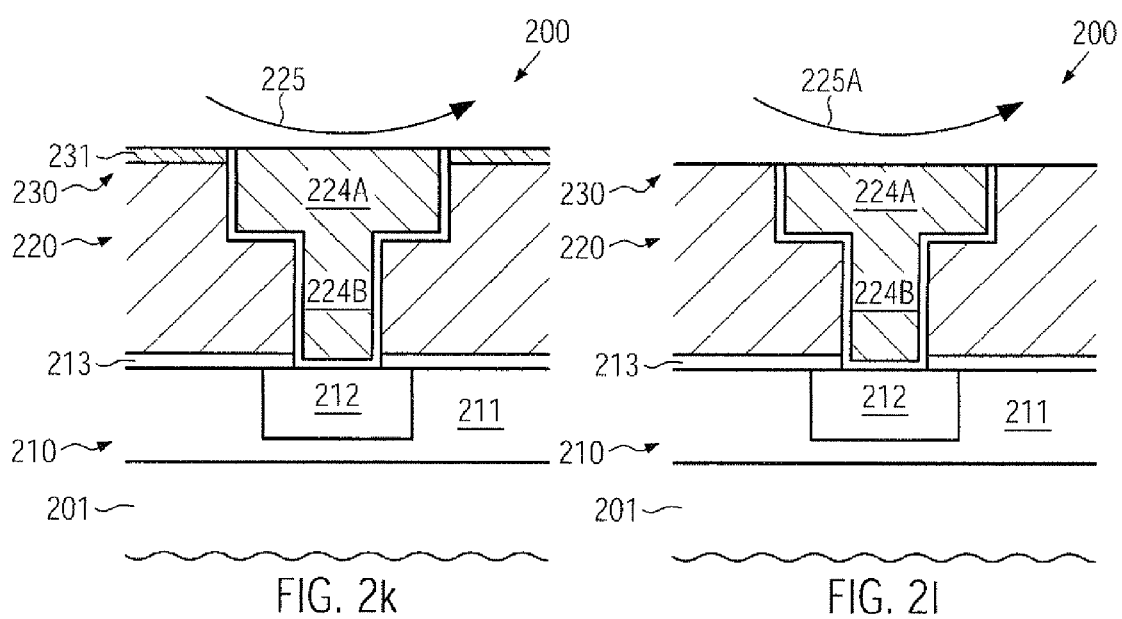

METHOD FOR PATTERNING A METALLIZATION LAYER BY REDUCING RESIST STRIP INDUCED DAMAGE OF THE DIELECTRIC MATERIAL

BACKGROUND OF THE INVENTION

1. Field of the Invention

Generally, the present disclosure relates to the fabrication of integrated circuits, and, more particularly, to the formation of metallization layers of reduced permittivity by using low-k dielectric materials.

2. Description of the Related Art

In an integrated circuit, a very large number of circuit elements, such as transistors, capacitors, resistors and the like, are formed in or on an appropriate substrate, usually in a substantially planar configuration. Due to the large number of circuit elements and the required complex layout of advanced integrated circuits, the electrical connections of the individual circuit elements are generally not established within the same level on which the circuit elements are manufactured. Typically, such electrical connections are formed in one or more additional "wiring" layers, also referred to as metallization layers. These metallization layers generally include metal-containing lines, providing the inner-level electrical connection, and a plurality of inter-level connections, also referred to as vias, which provide the electrical connection between two neighboring stacked metallization layers, wherein the metal-containing lines and vias may also be commonly referred to as interconnect structures.

Due to the ongoing demand for shrinking the feature sizes of highly sophisticated semiconductor devices, highly conductive metals, such as copper and alloys thereof, in combination with a low-k dielectric material, have become a frequently used alternative in the formation of metallization layers. Typically, a plurality of metallization layers stacked on top of each other is necessary to realize the connections between all internal circuit elements and I/O (input/output), power and ground pads of the circuit design under consideration. For extremely scaled integrated circuits, the signal propagation delay and, thus, the operating speed of the integrated circuit may no longer be limited by the field effect transistors but may be restricted by the close proximity of the metal lines, owing to the increased density of circuit elements, requiring an even more increased number of electrical connections, since the line-to-line capacitance is increased, which is accompanied by the fact that the metal lines have a reduced conductivity due to a reduced cross-sectional area. For this reason, traditional dielectrics, such as silicon dioxide (k>3.6) and silicon nitride (k>5), are replaced by dielectric materials having a lower dielectric constant k, which are therefore also referred to as low-k dielectrics having a relative permittivity of 3.0 or less. The reduced permittivity of these low-k materials is frequently achieved by providing the dielectric material in a porous configuration, thereby offering a k-value of significantly less than 3.0. Due to the intrinsic properties, such as a high degree of porosity, of the dielectric material, however, the density and mechanical stability or strength may be significantly less compared to the well-approved dielectrics silicon dioxide and silicon nitride.

During the formation of copper-based metallization layers, a so-called damascene or inlaid technique is usually used, due to copper's characteristic of substantially not forming volatile etch products when being exposed to well-established anisotropic etch ambients. In addition, copper may also not be deposited with high deposition rates on the basis of well-established deposition techniques usually used for aluminum, such as chemical vapor deposition (CVD). Thus, in the inlaid technique, therefore, the dielectric material is patterned to receive trenches and/or vias, which are subsequently filled with the metal by an efficient electrochemical deposition technique. Moreover, a barrier layer is usually formed on exposed surface portions of the dielectric material prior to filling in the metal, which provides the desired adhesion of the metal to the surrounding dielectric material and also suppresses copper diffusion into sensitive device areas, as copper may readily diffuse in a plurality of dielectric materials, in particular in porous low-k dielectrics.

In some conventional approaches, the process of filling in a conductive metal, such as copper, may be accomplished in a so-called dual damascene strategy, in which the via opening, connecting to an underlying metal region, and a corresponding trench may be filled in a common deposition process, thereby enhancing the overall process efficiency. For this purpose, the via opening and the trench are formed in the dielectric material of the metallization layer under consideration and subsequently the barrier material and the copper material are filled in, wherein each of these processes may be performed commonly for the via opening and the trench. For example, after the deposition of an appropriate dielectric material, for instance a low-k dielectric material, a patterning sequence is performed, wherein, in some illustrative approaches, the via opening may be formed first, at least partially, followed by the patterning of a trench in the upper portion of the dielectric material. Consequently, in this approach, the patterning of the trenches has to be accomplished on the basis of a surface topography including the previously formed via openings or portions thereof, which may be accomplished by planarizing the surface topography prior to lithographically patterning an etch mask for the trench etch process. Thus, during the overall patterning sequence, resist masks, possibly in combination with appropriate planarization materials, which may frequently be provided in the form of organic materials, may have to be deposited and formed above the dielectric material with a subsequent resist removal process, which may increasingly damage the sensitive dielectric material, in particular when highly-scaled semiconductor devices are considered, which may require ultra low dielectric constant, for example based on porous dielectric materials, as will be described in more detail with reference to FIGS. 1a-1d.

FIG. 1a schematically illustrates a cross-sectional view of a semiconductor device 100 in an advanced manufacturing stage, in which one or more metallization layers are to be formed above a device level of the semiconductor device 100. In the manufacturing stage shown, the semiconductor device 100 comprises a substrate 101, which, for convenience, is to be considered as an appropriate carrier material having formed thereon one or more material layers for receiving semiconductor circuit elements, such as transistors, capacitors, resistors and the like, which for convenience are not shown in FIG. 1a. For example, the substrate 101 may represent a semiconductor material, for instance, a silicon material in combination with an appropriate semiconductor layer, such as a silicon-based layer, in and above which transistor elements may be formed. In other cases, a buried insulating layer (not shown) may be formed between the substrate material and the corresponding semiconductor layer, thereby providing a semiconductor-on-insulator (SOI) configuration. As previously discussed, the circuit elements provided in the device level of the semiconductor device 100 may have critical dimensions of approximately 40 nm and less, depending on the technology standard under consideration.

Above the substrate 101, including the semiconductor circuit elements, a metallization system is provided, which may be represented by a first metallization layer 110 comprised of a dielectric material 111, which may be provided in the form of a conventional dielectric material, such as silicon dioxide, silicon nitride, silicon oxynitride and the like, depending on the overall device and process requirements. In sophisticated applications, the dielectric material 111 may comprise a low-k dielectric material to reduce the overall parasitic capacitance between adjacent metal regions. Furthermore, the metallization layer 110 may comprise a metal region, for instance in the form of a metal line 112, which may include a highly conductive metal, such as copper, in combination with a barrier material 112A, which in turn may include two or more layers, such as tantalum, tantalum nitride and the like, in order to obtain the desired barrier and adhesion effect. For example, tantalum nitride may provide enhanced adhesion to the surrounding dielectric material, while tantalum may provide a superior copper diffusion blocking effect, while also endowing enhanced mechanical stability to the copper material of the metal region 112. Furthermore, the metallization layer 110 may include an etch stop layer 113, which may be comprised of silicon nitride, silicon carbide, nitrogen-containing silicon carbide and the like, wherein the etch stop layer 113 may not only act as an etch stop material during the further processing of the device 100, but may also confine an upper surface of the metal line 112, for instance in view of undue copper diffusion and any interaction of reactive components, such as oxygen, fluorine, with the highly reactive copper material in the metal line 112.

A further metallization layer 120 is provided in an initial stage, that is, a dielectric material 121 is formed above the metallization layer 110 and is comprised of an appropriate material and with a desired thickness so as to receive a via opening and a trench opening in accordance with the design rules in a subsequent manufacturing stage. For instance, in sophisticated applications, the dielectric material 121 may comprise a low-k dielectric material having a reduced density, for instance by creating a porous structure so as to obtain moderately low values for the dielectric constant. Thus, the dielectric material 121 may exhibit a reduced mechanical stability and may also be sensitive to a plurality of etch chemistries which may be frequently applied during the further processing of the device. For this reason, typically, a cap layer 122 may be provided in an attempt to enhance the overall resistivity of the dielectric material 121 with respect to the further processing. For example, the cap layer 122 may be comprised of any appropriate material, for instance silicon dioxide, and the like, or the cap layer 122 may represent a surface portion of the dielectric material 121 having received an appropriate treatment, such as an oxidation process and the like. Furthermore, in the manufacturing stage shown, an etch mask 130 may be formed above the cap layer 122 and may be comprised of one or more resist materials, possibly in combination with other organic materials or other anti-reflective coating (ARC) materials, according to well-established techniques, so as to enable a lithographic patterning of the etch mask 130.

Typically, the device 100 as shown in FIG. 1a may be formed on the basis of well-established process techniques. For example, the circuit elements (not shown) may be formed by using sophisticated process techniques in conformity with design rules in order to obtain feature sizes as required. After forming an appropriate contact structure (not shown), that is, an interlayer dielectric material having a planarized surface topography for enclosing and passivating the circuit elements, including appropriate conductive elements connecting to contact areas of the circuit elements, the one or more metallization layers 110, 120 may be formed. For this purpose, the dielectric material 111 may be deposited and subsequently be patterned to receive vias and/or trenches, followed by the deposition of the barrier material 112A, which may be accomplished by sputter deposition, chemical vapor deposition (CVD) and the like. It should be appreciated that the metallization layer 110 may be formed by similar process techniques, as will be described with reference to the metallization layer 120, depending on the overall process and device requirements. Thereafter, the metal, such as copper, may be filled in, for instance, by electroplating, wherein, prior to the electrochemical deposition process, a conductive seed layer, such as copper and the like, may be formed by appropriate deposition techniques, such as sputter deposition, electroless plating and the like. After filling in the copper material, any excess material thereof may be removed, for instance by electrochemical etching, chemical mechanical polishing (CMP) and the like. Next, the etch stop layer 113 may be formed by depositing one or more appropriate materials, on the basis of well-established CVD techniques. Next, the dielectric material 121 may be formed by any appropriate deposition technique, such as CVD, spin-on processes and the like. Thereafter, the cap layer 122 may be formed, for instance, by oxidizing a surface portion of the dielectric material 121, if the material 121 has an appropriate material composition, or by depositing an appropriate thin material layer so as to not unduly affect the overall permittivity of the dielectric material 121. Finally, the etch mask 130 may be formed by depositing a resist material, possibly in combination with appropriate ARC materials and the like and performing a lithography process to form an opening 130A that substantially corresponds to a via opening to be formed in the dielectric material 121. Based on the etch mask 130, an etch process 131 is performed for etching through the material 121, wherein the corresponding etch process is stopped on and in the etch stop layer 113. Subsequently, the etch mask 130 is removed, for instance by resist stripping processes including oxygen plasma based recipes, possibly in combination with reactive components such as fluorine, which may be present in the etch chamber due to the previously performed etch steps, which may result in a more or less pronounced material removal of the cap layer 122 and possibly of the sensitive dielectric material 121.

FIG. 1b schematically illustrates the semiconductor device 100 after the above-described process sequence. Hence, the cap layer 122 and possibly a surface area of the dielectric material 121 may exhibit a certain degree of etch damage 122A caused by the previous etch processes for removing the etch mask 130.

FIG. 1c schematically illustrates the semiconductor device 100 in a further advanced manufacturing stage, in which a planarization material 132, for instance in the form of an organic material, may be formed in the via opening 121A and above the dielectric material 121 and the cap layer 122. As previously explained, the planarization material 132 may provide a substantially planarized surface topography and may also act as an ARC material during the lithography process for patterning a further etch mask 133, which may be provided in the form of a resist material and the like. The planarization layer 132 may be formed by depositing an appropriate material in a low viscous state by spin-on techniques and subsequently hardening the material 132. Thereafter, an appropriate resist material may be deposited and may be patterned to form a trench opening 133A, which may be used as an etch mask during an etch process 134. During the etch process 134, the planarization layer 132 may be patterned first and subsequently the material of the layer 121 may be removed so as to form a trench therein. Thereafter, the mask 133 and the planarization material 132 may be removed, for instance, by well-established plasma strip recipes, during which, however, the dielectric material 121 and cap layer 122 may be exposed to the corresponding reactive ambient.

FIG. 1d schematically illustrates the semiconductor device 100 after the above-described process sequence, wherein a trench 121T may be formed in an upper portion of the dielectric material 121, which, however, may comprise significant damage at a surface 122B thereof, due to the preceding plasma-based processes for removing the etch mask 133 and the planarization layer 132. Consequently, in particular in highly scaled semiconductor devices, significant surface irregularities may be created in the dielectric materials of respective metallization layers, thereby providing non-uniform process conditions during the further processing of the devices, for instance in view of subsequent deposition techniques for forming a barrier material and a highly conductive metal in combination with subsequent planarization processes, wherein the highly irregular surface conditions of the dielectric material 121 may also have a negative impact on the finally obtained device characteristics.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein relates to a technique for forming metallization systems according to a patterning regime in which the exposure of sensitive dielectric materials to reactive etch ambients, such as oxygen-plasma based removal processes, may be significantly reduced in order to provide enhanced surface integrity of the dielectric material. For this purpose, a hardmask layer may be formed above the dielectric material and may be used for forming a trench in the dielectric material, wherein the patterning of the hardmask layer may be accomplished such that undue exposure of the hardmask to plasma-based reactive etch ambients may also be reduced. Consequently, integrity of the hardmask may be maintained up to a point in time in which the respective trench is to be patterned in an upper portion of the dielectric material. Consequently, during the patterning of a via opening and during the formation of the trench, the hardmask layer may confine the sensitive dielectric material, thereby resulting in an overall enhanced surface integrity of the dielectric material. In some illustrative aspects, direct contact of the dielectric material with a resist material may be suppressed by providing an appropriate cap layer prior to forming the trench opening in the dielectric material.

One illustrative method disclosed herein comprises forming a stack of layers on a low-k dielectric layer formed above a substrate of a semiconductor device, wherein the stack of layers comprises a hardmask layer formed above the low-k dielectric layer and comprises a first cap layer formed on the hardmask layer. The method further comprises forming a first opening in the stack of layers and forming a second opening in the first cap layer using the hardmask layer as an etch stop. Additionally, the method comprises forming a first portion of a via opening in the low-k dielectric layer using the hardmask as a first etch mask. Furthermore, a trench mask is formed by removing a portion of the hardmask layer exposed by the second opening by using the first cap layer as a second etch mask. Additionally, the method comprises forming a second portion of the via opening and a trench in the low-k dielectric layer on the basis of the trench etch mask.

A further illustrative method disclosed herein comprises forming a hardmask layer above a dielectric material of a metallization layer of a semiconductor device, wherein the hardmask layer comprises a first material layer formed above the dielectric material and a second material layer formed on the first material layer. The method further comprises forming a first opening in the hardmask layer, which corresponds to a via opening to be formed in the dielectric material. Furthermore, the method comprises forming the via opening in the dielectric material using at least the first material layer of the hardmask as an etch mask and forming a cap layer above the hardmask layer and in the first opening. Moreover, a second opening is formed in the hardmask layer, which corresponds to a trench to be formed in the dielectric material. Additionally, the method comprises forming the trench in the dielectric material by using at least the first material layer as an etch mask.

Another illustrative method disclosed herein relates to the patterning of a dielectric material of a metallization layer of a semiconductor device. The method comprises forming a first hardmask layer above the dielectric material and forming a second hardmask layer on the first hardmask layer. Additionally, a first opening is formed in the first and second hardmask layers, wherein the first opening corresponds to a via opening to be formed in the dielectric material. Furthermore, the method comprises forming a second opening in the second hardmask layer and forming a first portion of the via opening in the dielectric material, wherein the second opening corresponds to a trench to be formed in the dielectric material. Additionally, a second opening is formed in the first hardmask layer and the trench and a second portion of the via opening are formed by using the first hardmask layer as an etch mask.

BRIEF DESCRIPTION OF THE DRAWINGS

The disclosure may be understood by reference to the following description taken in conjunction with the accompanying drawings, in which like reference numerals identify like elements, and in which:

FIGS. 1a-1d schematically illustrate cross-sectional views of a conventional semiconductor device during various manufacturing stages for patterning the dielectric material of a metallization layer according to conventional strategies;

FIG. 2a-2k schematically illustrate cross-sectional views of a semiconductor device during various manufacturing stages in forming a metallization layer with a significant reduction of exposure of a sensitive dielectric material to a reactive etch ambient on the basis of an appropriately designed hardmask layer stack according to illustrative embodiments;

FIG. 2l schematically illustrates the semiconductor device in an advanced manufacturing stage, in which the hardmask material may be removed, according to further illustrative embodiments;

Figures 2A, 2B:
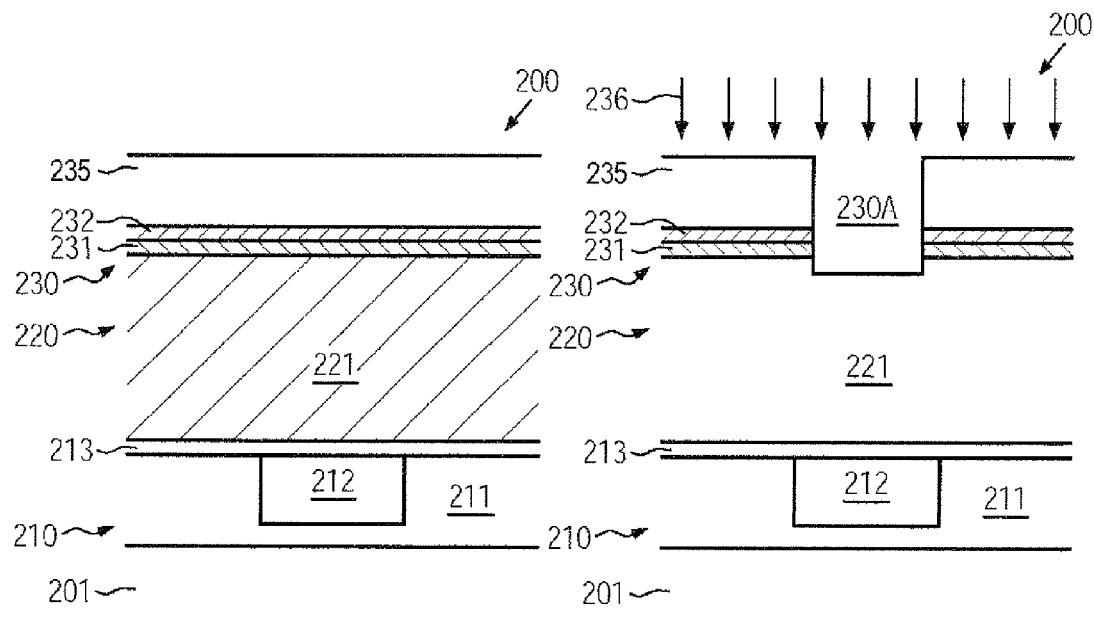

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure relates to techniques for forming metallization layers of sophisticated semiconductor devices, which may typically comprise sensitive dielectric materials, such as low-k dielectrics, porous low-k dielectrics and the like, to enhance the overall performance of the semiconductor devices. The present disclosure contemplates a significant reduction of the degree of exposure of the sensitive dielectric material to reactive etch atmospheres, the application of which may be required during a patterning regime for forming via openings and trenches in the dielectric materials, to enable a common fill process providing enhanced overall process efficiency. To this end, an appropriately designed stack of material layers, which may be referred to as hardmask layers or cap layers, is provided such that the via opening may be patterned on the basis of these layers, while the trench may be patterned on the basis of one or more of the layers in a state in which undue exposure to reactive etch atmospheres may be essentially avoided so as to provide a substantially intact etch mask during the trench patterning process, thereby reliably avoiding undue exposure of the underlying dielectric material to reactive etch ambients, as may typically be the case in conventional patterning regimes. In some illustrative embodiments, one or more of the material layers in the layer stack may be maintained during the further processing of the device, thereby imparting enhanced stability to the dielectric material, for instance during the deposition of appropriate barrier materials, the filling in of highly conductive metals, such as copper, and the subsequent removal of any excess material thereof. In some illustrative embodiments, the hardmask material may be removed, at least partially, during or after the removal of any excess material, for instance by CMP, thereby also avoiding exposure of the sensitive dielectric material to a reactive etch ambient. In this case, any undesired influence of the hardmask material with respect to device characteristics, such as the overall permittivity of the dielectric material and the like, may be reduced. Furthermore, well-established materials may be used for the hardmask, wherein, in some cases, one or more of the material layers of the stack for forming the hardmask may comprise a metal, such as tantalum, titanium, for instance in the form of tantalum nitride, titanium nitride, and the like, while other well-established materials, such as silicon dioxide, carbon and the like, may also be used. Therefore, a high degree of compatibility with the conventional overall process flow may be achieved, without additional resources in terms of materials and process tools, while at the same time providing enhanced integrity of sensitive dielectric materials.

FIG. 2a schematically illustrates a cross-sectional view of a semiconductor device 200 comprising a substrate 201, above which may be formed one or more metallization layers 210, 220. The substrate 201 may comprise one or more device levels, i.e., levels in and above which respective circuit elements in the form of semiconductor circuit elements, such as transistors, capacitors, resistors and the like, may be formed, as is also described when referring to the semiconductor device 100. Similarly, the metallization layer 210 may comprise a dielectric material 211, in which is embedded a contact region or metal region 212 comprised of any appropriate conductive material. The dielectric material 211 may comprise a low-k dielectric material, while a portion of the metal region 212 may be provided in the form of a highly conductive metal, such as copper, silver and the like, possibly in combination with appropriate barrier materials (not shown). Additionally, an etch stop layer 213 is formed on the dielectric material 211 and the contact or metal region 212. It should be appreciated that the metallization layer 210 may be configured in a similar manner as is described with reference to the semiconductor device 100.

Furthermore, in the manufacturing stage shown, the semiconductor device 200 may comprise a further metallization layer 220 comprising a dielectric material 221, which may represent any appropriate material for forming therein metal lines and vias. It should be appreciated that the dielectric material 221 may have a configuration as also described with reference to the dielectric material 121 of the device 100. Thus, the material 221 may represent a dielectric material having a dielectric constant of 3.0 and significantly less, wherein a more or less degree of porosity may also be established therein, depending on the overall device requirements. Furthermore, a stack of material layers 230 may be formed above the dielectric material 221, wherein, in one illustrative embodiment, the stack 230 may comprise a first material layer 231, which may also be referred to as a hardmask layer or a first hardmask layer, and a second material layer 232, which may also be referred to as a cap layer or a second hardmask layer. The first material layer 231 and the second material layer 232 may be provided so as to exhibit significant etch selectivity with respect to an appropriately designed etch ambient, as will be described later on in more detail. In some illustrative embodiments, the first material layer 231 may be comprised of a material composition including a metal, such as tantalum, titanium and the like, wherein respective material compositions represent well-established materials in conventional semiconductor production processes, so that respective engineering experience and resources for depositing and patterning such materials may be available. For instance, titanium nitride, tantalum nitride and the like may frequently be used as barrier materials during various stages of the overall manufacturing flow and may also be advantageously used as a hardmask material during the patterning of the dielectric material 221. In other illustrative embodiments, other materials may be used, such as silicon dioxide, polysilicon and the like. The second material layer 232 may be comprised of any appropriate material having a desired etch selectivity, wherein, in some illustrative embodiments, silicon dioxide, carbon, silicon carbide and the like may be used. For example, the first material 231 may be provided in the form of a metal nitride, while the second material layer 232 may be provided in the form of silicon dioxide, amorphous carbon and the like. In other cases, well-established material compositions, such as polysilicon and silicon dioxide, may be provided for the first and second material layers 231, 232.

Furthermore, in the manufacturing stage shown, a resist material 235 may be formed on the stack 230 and may have any appropriate composition for a subsequent lithography process for patterning the stack 230. For instance, the resist material 235 may include one or more resist materials appropriate for obtaining the desired optical characteristics. For this purpose, the thickness of the resist layer 235 and of one or more of the layers of the stack 230 may be adjusted so as to obtain the desired anti-reflective behavior during a subsequent lithography process. In other cases, the resist layer 235 may comprise additional anti-reflective coating (ARC) materials so as to reduce back reflections into the resist layer 235 during the lithography process.

The semiconductor device 200 as shown in FIG. 2a may be formed on the basis of the following processes. The substrate 201 and any circuit elements contained therein, as well as the first metallization layer 210 and the dielectric material 221, may be formed on the basis of similar process techniques, as are also described with reference to the device 100. It should be appreciated that, depending on the overall device and process requirements, upon deposition of the dielectric material 221, a respective cap layer (not shown) may be formed, so as to further enhance the overall mechanical integrity of the layer 221, as previously explained. In other cases, an additional cap layer may be omitted due to the presence of the layer stack 230, while, in other cases, a respective cap layer may be incorporated into the stack 230, as will be discussed later on in more detail. Consequently, after the deposition of the dielectric material 221, which may comprise an appropriate surface layer, if required, the stack 230 may be formed, for instance, by first depositing the material layer 231 on the dielectric layer 221 on the basis of any appropriate deposition technique including, for instance, CVD techniques, physical vapor deposition, such as sputter deposition, electrochemical deposition and the like. As previously indicated, a plurality of well-established deposition recipes may be available and may be used for forming the layer 231, since, in some illustrative embodiments, well-established materials may be used. Next, the layer 232 may be formed by any appropriate deposition technique, wherein, in some illustrative embodiments, a thickness of the layer 232 may be selected in compliance with the optical characteristics such that a substantially anti-reflective behavior may be achieved in combination with the resist layer 235, as previously indicated. In some illustrative embodiments, a substantially nitrogen-free material composition may be selected for the layer 232, so as to suppress undue nitrogen diffusion into the resist layer 235, which may otherwise change the photochemical response of the material 235. Next, the resist material 235 may be deposited and may be subsequently exposed on the basis of advanced lithography techniques as are well established in the art. After development of the exposed resist layer 235, a respective etch mask may be provided to pattern the layer stack 230.

FIG. 2b schematically illustrates the semiconductor device 200 during an etch process 236 performed on the basis of an etch recipe for etching through the stack 230, i.e., the layers 232 and 231. If required, the etch process 236 may include two different etch steps on the basis of respective etch chemistry for etching through the different materials 232 and 231, while, in other cases, a substantially non-selective etch chemistry may be used. Thus, an opening 230A may be formed in the stack 230, wherein the opening 230A may substantially correspond to a via opening to be formed in the dielectric material 221. In general, the etch process 236 may be less critical, since a moderate thickness for the layers 231 and 232 may be provided, for instance, a thickness of approximately 20 nm and less may be used for both the first and the second material layers 231, 232, so that a moderately low thickness of the resist layer 235 may be sufficient in order to provide the opening 230A.

Figures 2C, 2D:
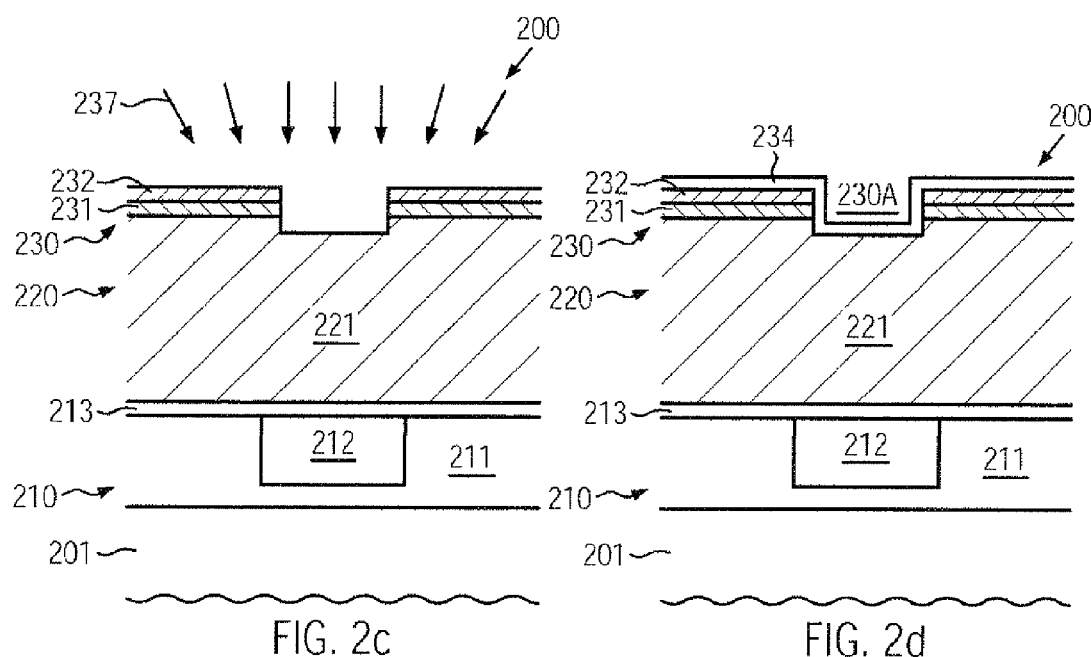

FIG. 2c schematically illustrates the semiconductor device 200 during a further etch process 237, that is, a plasma-based etch process for removing the resist layer 235, which may be performed on the basis of oxygen plasma and the like. During the resist removal process 237, the stack 230 may reliably avoid undue exposure of surface portions of the dielectric material 221, except within the opening 230A, in which a damage of material 221 may not affect the overall processing, since this portion may be removed at a later manufacturing stage. Furthermore, during the etch process 237, the first material layer 231, which may act as a hardmask for patterning a trench in the upper portion of the dielectric material 221, may be reliably protected by the second material 232, wherein corresponding material in the layer 232 may not have any effect on the further processing.

FIG. 2d schematically illustrates the semiconductor device 200 according to one illustrative embodiment in which enhanced overall process robustness may be accomplished by providing an additional cap layer 234 above the layer stack 230 and within the opening 230A. The cap layer 234 may be provided as a buffer material to reduce contamination during the subsequent lithography process, since the respective contaminants may be contained in the dielectric material 221 and may be readily diffused into a resist material, when coming into direct contact with the material 221. For instance, nitrogen may be present in the dielectric material 221, which may cause a modification of a resist material, in particular if resist materials for short exposure wavelengths are considered. Thus, the layer 234 may be provided as a substantially nitrogen-free material having a sufficient density so as to significantly reduce a diffusion activity of more or less volatile materials in the dielectric material 221. For example, silicon dioxide, carbon, silicon carbide and the like may be used. It should be appreciated that, in other illustrative embodiments, the additional cap layer 234 may be omitted if a direct contact with a resist material may be acceptable.

FIG. 2e schematically illustrates the semiconductor device 200 in an advanced manufacturing stage in which a resist material 238, possibly in combination with other organic components for enhancing surface topography and/or optical characteristics, may be formed above the stack 230, while, in the embodiment shown, the material 238 may be formed on the additional cap layer 234. Furthermore, a lithography process may be performed to define the lateral dimensions of a trench to be formed in the dielectric material 221, as indicated by the dashed lines. Thus, in the embodiment shown, the resist system 238 may be formed on the basis of less critical surface conditions compared to the conventional approach, as previously described.

FIG. 2f schematically illustrates the semiconductor device 200 after patterning the resist system 238 and during an etch process 239, during which an upper portion 221U of a via opening may be formed in the material 221. For this purpose, well-established etch processes may be used during the process 239 so as to first remove the cap layer 234 and subsequently etch into the material 221, wherein conventional etch recipes may be used, as are also used in the conventional strategy, as previously described. During the etch process 239, an exposed portion of the second material layer 232 may also be removed, depending on the overall etch characteristics. Due to the etch selectivity of the first layer 231 with respect to the second layer 232 in view of the etch process 239, the layer 231 may act as an etch mask for forming the portion 221U, thereby providing the desired etch fidelity. In some illustrative embodiments, the etch process 239 may be designed as a substantially non-selective etch process with respect to the materials of the cap layers 234, 232 and the dielectric material 221, while the layer 231 may act as a hardmask for forming the opening 221U.

FIG. 2g schematically illustrates the semiconductor device 200 during a further etch sequence 240, which may be designed to remove an exposed portion of the first material layer 231, thereby forming a second opening 230B, the lateral dimensions of which substantially correspond to a trench to be formed in the material 221. For this purpose, any appropriate etch chemistry may be used that allows etching of material of the layer 231, wherein a selectivity with respect to the material 221 may not be critical, since exposed portions thereof may be removed at any rate in a later manufacturing stage. It should be appreciated that the resist layer 238 (FIG. 2f) may still act as an etch mask during the sequence 240, while, in other cases, the resist layer 238 may be removed, while the cap layers 232 and 234 may reliably protect the covered portions of the layer 231, while damaging the exposed portions of the layer 231 within the opening 230B, which may be advantageous so as to reduce overall process time for removing the exposed portion within the opening 230B, while the cap layers 232 and 234 may act as respective etch masks. Thus, undue exposure of the covered portions of the layer 231 with respect to the etch ambient of the process 240 may be suppressed, thereby maintaining integrity of the layer 231, which may act as an efficient trench etch mask during the further processing.

FIG. 2h schematically illustrates the semiconductor device 200 in a further advanced manufacturing stage, in which an etch process 241 may be performed on the basis of the hardmask 231, thereby deepening the opening 221U (FIG. 2g) to form a via opening 221A, while also forming a trench 221T in an upper portion of the dielectric layer 221. It should be appreciated that the etch process 241 may include a process step for removing the cap layers 232, 234 selectively with respect to the material 221, while, in other illustrative embodiments, the etch chemistry of the process 241 may not have the pronounced selectivity with respect to the materials of the cap layers 232, 234 at the one hand, and the dielectric material 221 on the other hand. During the etch process 241, a depth of the trench 221T may be adjusted on the basis of a controlled etch time, while a reliable stop of the etch process in the via 221A may be accomplished by means of the etch stop layer 213. Thereafter, an appropriately designed etch step may be performed to etch through the etch stop layer 213.

FIG. 2i schematically illustrates the semiconductor device 200 after the above-described process sequence, so that the via opening 221A may expose a portion of the metal region 212. In some illustrative embodiments, the further processing may be continued by depositing a barrier layer, if required, and subsequently filling the trench 221T and the via opening 221A with an appropriate metal, such as copper and the like, wherein, if required, an additional deposition process may be performed to provide a seed layer. For this purpose, well-established process techniques may be applied.

FIG. 2j schematically illustrates the semiconductor device 200 after the above-described process sequence. Hence, a barrier layer 223 may be formed on the hardmask layer 231 and within the trench 221T and the via opening 221A and a metal layer 224 may be provided so as to reliably fill the trench 221T and the via opening 221A.

FIG. 2k schematically illustrates the device 200 during a removal process 225, which may comprise any appropriate process technique, for instance electrochemical etching, CMP and the like. In one illustrative embodiment, the hardmask layer 231 may also be used as a stop layer for the process 225, for instance during a final CMP step, thereby maintaining integrity of the sensitive dielectric material 221. Thus, as shown, a metal line 224A and a via 224B may be formed after the removal process 225 with the remaining portion of the layer 231 acting as a cap layer for the material 221. In this case, the layer 231 may be provided as a dielectric material so as to not unduly influence the overall electrical characteristics of the metallization layer 220. In other illustrative embodiments, the layer 231 may comprise a metal and may have a certain conductivity, which may require the removal of the layer 231. This may be accomplished at any appropriate manufacturing stage after forming the trench 221T and the via opening 221A (FIG. 2i), while, in some illustrative embodiments, the layer 231 may be removed during or after the removal process 225.

FIG. 2l schematically illustrates the semiconductor device 200 during a further CMP step 225A, in which the layer 231 may be removed. In some illustrative embodiments, the barrier layer 230 and the hardmask layer 231 may be comprised of materials of similar characteristics with respect to a CMP process or these material layers may have substantially the same composition so that the removal of the layer 231 may be accomplished during the process 225.

As a consequence, the patterning regime described above may provide enhanced integrity of the dielectric material 221, since exposure to reactive etch atmospheres may be substantially avoided, while also the integrity of at least one material layer of the stack 230 may also be maintained, thereby providing enhanced etch fidelity during the respective patterning sequences for forming the via opening 221A and the trench 221T. In the above embodiments, the layer stack 230 may comprise two layers, one of which, i.e., the layer 231, may represent the actual hardmask layer, while layer 232 may provide the desired enhanced integrity of the hardmask layer prior to the actual trench etch step. In other illustrative embodiments, the layer stack 230 may comprise one or more additional layers, for instance with respect to enhancing integrity of the dielectric material 221, in particular with respect to removing the actual hardmask layer 231.

Figures 2M, 2N:
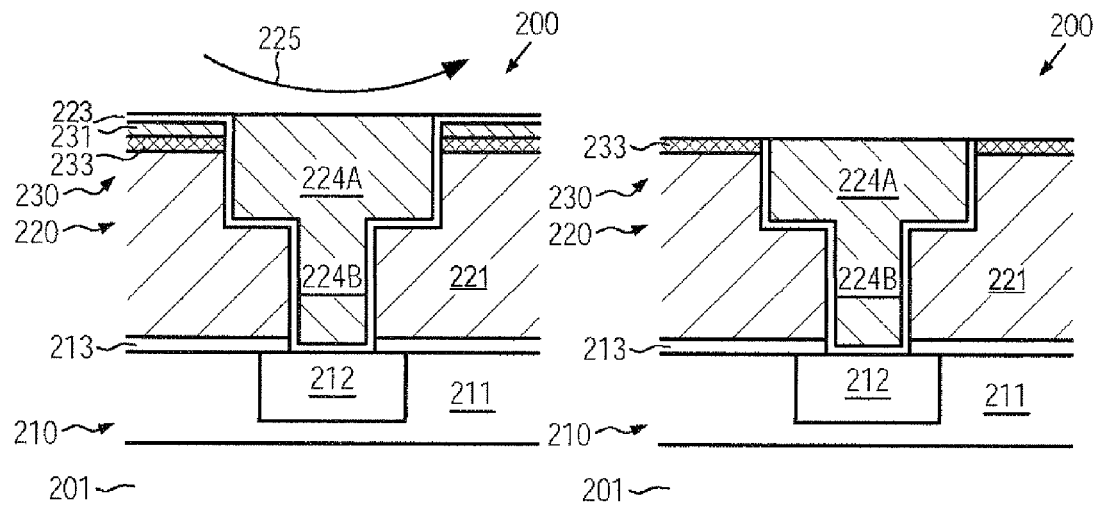
FIGS. 2m-2n schematically illustrate cross-sectional views of the semiconductor device according to still other illustrative embodiments, in which an additional cap layer may be provided in the hardmask layer stack that may be used as a control layer during the removal of an upper portion of the hardmask layer stack.

FIG. 2m schematically illustrates the device 200 according to further illustrative embodiments, in which an additional cap layer 233 may be provided, for instance, in the form of silicon dioxide, carbon, silicon carbide and the like, as may be compatible with the overall device requirements. For example, the additional cap layer 233 may be formed as a portion of the initial layer stack 230 prior to deposition of the actual hardmask layer 231. The further processing, i.e., the patterning of the stack 230 including the additional cap layer 233, may be performed in a similar manner as previously described, while the provision of the layer 233 results in increased flexibility in selecting appropriate materials for the layer 231, since a direct contact with the material 221 may be suppressed by the layer 233. In the manufacturing stage shown, the removal process 225 may be performed to remove excess material of the metal layer 224 (FIG. 2j), as previously described, and the process 225 may also include a further removal process, such as a CMP step, in order to also remove the barrier layer 223 and the layer 231, wherein the additional cap layer 233 may provide enhanced integrity of the sensitive dielectric material 221.

FIG. 2n schematically illustrates the device 200 after the removal process 225, wherein the hardmask layer 231 may be removed, while the layer 233, or at least a portion thereof, may still cover the surface of the dielectric material 221.

Figures 2O, 2P:
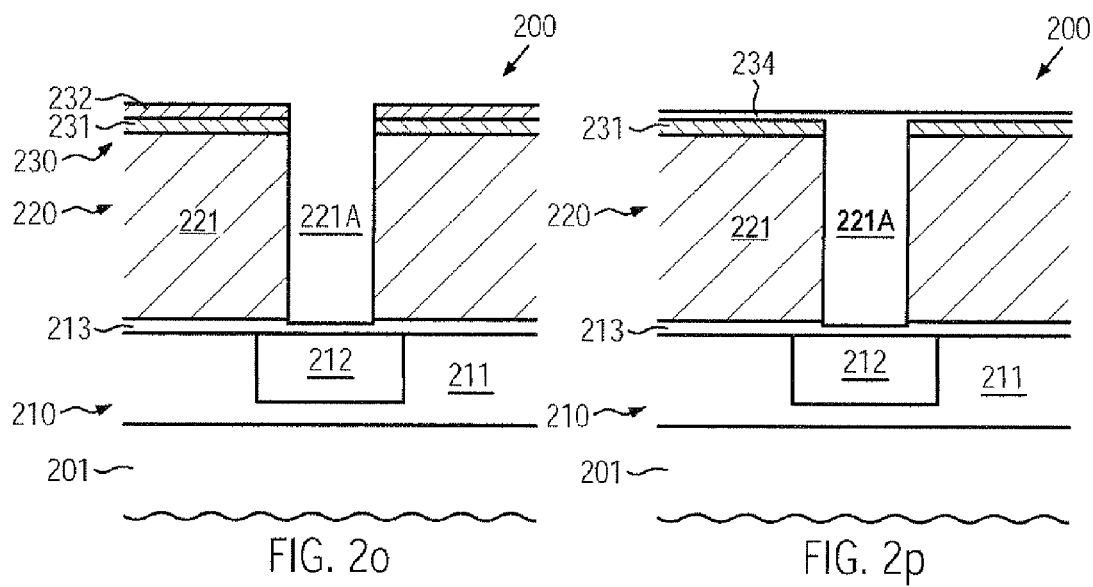
FIGS. 2o-2p schematically illustrate cross-sectional views of the semiconductor device according to still further illustrative embodiments, in which a via opening may be formed first on the basis of a hardmask, wherein undue exposure of exposed surface of the via opening may be reduced by providing a cap layer.

With reference to FIGS. 2o-2p, further illustrative embodiments are now described, in which the via opening 221A may be formed prior to actually performing the trench etch process, thereby obtaining a high degree of compatibility with the conventional process sequence as previously described with reference to the device 100.

FIG. 2o schematically illustrates the device 200 with the material layer stack 230, which may have been patterned, as is, for instance, described above, so as to form the first opening 230A therein (see FIG. 2e). Thereafter, the resist material may be removed, as previously described, wherein the cap layer 232 may cover mask layer 231 so as to suppress an undue interaction with the reactive ambient during the resist strip process. Thereafter, an anisotropic etch process may be performed on the basis of the layers 232, 231, while, in other cases, the layer 232 may also be removed during the corresponding etch process, when a pronounced etch selectivity of the etch recipe with respect to the layers 221 and 232 may not be provided. In this case, the hardmask 231 may act as an etch mask for forming the via opening 221A.

FIG. 2p schematically illustrates the device 200 in a further advanced manufacturing stage, in which a planarization material 234 may be formed in the opening 221A and above the layer 231, as previously described in the context of the device 100, to provide a substantially planar surface topography and also provide the desired optical characteristics. Furthermore, in some illustrative embodiments, the cap layer 234 may be formed in the opening 221A so as to avoid direct contact with the dielectric material 221, which may be advantageous with respect to the incorporation of contaminating species from the planarization material 234 into the dielectric material 221. For this purpose, any appropriate material, such as silicon dioxide, carbon and the like, may be used, as is also discussed above. Thereafter, the further processing may be continued in a similar manner as described with reference to the device 100, wherein, however, the hardmask layer 231 may be used during the trench patterning process and may also provide integrity of the material 221 during the removal of the resist mask, including the planarization material 234. Hence, a high degree of compatibility with conventional strategies may be obtained, while nevertheless providing enhanced process uniformity.

As a result, the techniques disclosed herein provide an enhanced patterning regime for forming trenches and via openings in a dielectric material of advanced semiconductor devices by significantly reducing the exposure of the sensitive dielectric material to reactive resist stripping processes, which may enhance the overall process uniformity.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a stack of layers on a low-k dielectric layer formed above a substrate of a semiconductor device, said stack of layers comprising a hardmask layer formed above said low-k dielectric layer and a first cap layer formed on said hardmask layer;
    forming a first opening in said stack of layers corresponding to a via opening to be formed in said low-k dielectric layer;
    forming a first portion of said via opening in said low-k dielectric layer after forming said first opening using said hardmask layer as a first etch mask;
    forming a trench etch mask by forming a second opening in said hardmask layer after forming said first portion of said via opening; and
    performing an etching process to form a second portion of said via opening and to form a trench in said low-k dielectric layer on the basis of said trench etch mask, wherein said cap layer is removed from above said hardmask layer during said etching process.

2. The method of claim 1, further comprising forming a second cap layer in said first opening prior to forming said second opening.

3. The method of claim 1, further comprising etching through an etch stop layer formed below said low-k dielectric layer to form said via opening to extend to a contact region formed below said etch stop layer.

4. The method of claim 1, further comprising filling said via opening and said trench with a metal in a common fill process.

5. The method of claim 4, further comprising forming a conductive barrier layer in said trench and said via opening prior to filling said via opening and said trench with a metal.

6. The method of claim 5, further comprising removing excess material and at least a portion of said hardmask layer by a planarization process.

7. The method of claim 1, wherein forming said stack of layers comprises forming a bottom cap layer above said low-k dielectric layer and forming said hardmask layer on said bottom cap layer.

8. The method of claim 7, further comprising removing said hardmask layer after forming said trench by using said bottom cap layer as a stop material.

9. The method of claim 1, wherein said hardmask layer comprises a metal.

10. The method of claim 9, wherein said metal is at least one of tantalum and titanium.

11. The method of claim 1, wherein said first cap layer is comprised of at least one of silicon dioxide and carbon.

12. A method, comprising:
forming a hardmask layer above a dielectric material of a metallization layer of a semiconductor device, said hardmask layer comprising a first material layer formed above said dielectric material and a second material layer formed on said first material layer;
forming a first opening in said hardmask layer, said first opening corresponding to a via opening to be formed in said dielectric material;
forming a cap layer above said hardmask layer and in said first opening;
after forming said cap layer, forming said via opening in said dielectric material after forming said first opening using at least said first material layer of said hardmask layer as an etch mask;
forming a second opening in said hardmask layer after forming said via opening, said second opening corresponding to a trench to be formed in said dielectric material; and
performing an etching process to form said trench in said dielectric material by using said first material layer as an etch mask, wherein said cap layer and said second material layer are removed from above said first material layer during said etching process.

13. The method of claim 12, further comprising removing said first material layer by chemical mechanical polishing.

14. The method of claim 13, further comprising filling said via opening and said trench with a metal-containing material and removing said hardmask layer after removing excess material of said metal-containing material.

15. The method of claim 13, wherein said first material layer of said hardmask layer comprises a metal.

16. The method of claim 12, further comprising forming a bottom layer above said dielectric material prior to forming said hardmask layer.

17. The method of claim 12, wherein forming said second opening in said hardmask layer comprises forming a patterned resist layer above said hardmask layer, performing an etching process to form said second opening, and removing said patterned resist layer prior to forming said trench.

18. The method of claim 12, wherein said cap layer is formed after forming said via opening and wherein said method further comprises forming a planarization material in said via opening prior to forming said second opening.

19. The method of claim 12, wherein forming said via opening comprises forming a first portion of said second opening in said second material layer and forming a first portion of said via opening in said dielectric layer prior to forming a second portion of said second opening in said first material layer.

20. The method of claim 19, further comprising forming a second portion of said via opening and said trench in a common etch sequence.

21. A method of patterning a dielectric material of a metallization layer of a semiconductor device, the method comprising:
forming a first hardmask layer above said dielectric material;
forming a second hardmask layer on said first hardmask layer;
forming a first opening in said first and second hardmask layers, said first opening corresponding to a via opening to be formed in said dielectric material;
forming a second opening in said second hardmask layer and a first portion of said via opening in said dielectric material after forming said first opening, said second opening corresponding to a trench to be formed in said dielectric material;
forming said second opening in said first hardmask layer; and
performing an etching process to form said trench and to form a second portion of said via opening by using said first hardmask layer as an etch mask, wherein said second hardmask layer is removed from above said first hardmask layer during said etching process.

22. The method of claim 21, further comprising forming a cap layer in said first opening prior to forming said second opening.

23. The method of claim 22, further comprising removing said first hardmask layer after forming said second portion of the via opening and said trench.

24. The method of claim 23, wherein said first hardmask layer comprises a metal.

* * * * *